United States Patent

Jones et al.

[11] Patent Number: 6,027,858
[45] Date of Patent: Feb. 22, 2000

[54] PROCESS FOR TENTING PTH'S WITH PID DRY FILM

[75] Inventors: Gerald Walter Jones, Apalachin; Ross William Keesler, Owego; Voya Rista Markovich, Endwell, all of N.Y.; Heinke Marcello, Brackney, Pa.; James Warren Wilson, Vestal; William Earl Wilson, Waverly, both of N.Y.

[73] Assignee: International Business Machines Corporation, Armonk, N.Y.

[21] Appl. No.: 08/870,950

[22] Filed: Jun. 6, 1997

[51] Int. Cl.[7] ............................... G03C 11/12; G03F 7/00
[52] U.S. Cl. ..................... 430/311; 430/313; 430/280.1
[58] Field of Search ................... 430/258, 328, 430/311, 330, 280.1, 313

[56] References Cited

U.S. PATENT DOCUMENTS

| | | | |
|---|---|---|---|
| 4,175,963 | 11/1979 | Crivello | 430/296 |
| 4,278,754 | 7/1981 | Yamashita et al. | 430/323 |
| 4,293,635 | 10/1981 | Flint et al. | 430/271 |
| 4,624,912 | 11/1986 | Zweifel et al. | 430/258 |
| 4,725,524 | 2/1988 | Elzer et al. | 430/258 |
| 4,728,568 | 3/1988 | Sasada et al. | 428/349 |
| 4,876,177 | 10/1989 | Akahoshi et al. | 430/313 |
| 4,882,245 | 11/1989 | Gelorme et al. | 430/14 |
| 4,927,983 | 5/1990 | Jones et al. | 174/258 |
| 5,026,624 | 6/1991 | Day et al. | 430/280 |
| 5,130,229 | 7/1992 | Chang et al. | 430/312 |
| 5,264,325 | 11/1993 | Allen et al. | 430/280 |
| 5,277,929 | 1/1994 | Seki et al. | 427/97 |
| 5,278,010 | 1/1994 | Day et al. | 430/18 |
| 5,300,402 | 4/1994 | Card, Jr. et al. | 430/280 |
| 5,304,457 | 4/1994 | Day et al. | 430/280 |
| 5,342,734 | 8/1994 | Lazarus et al. | 430/270 |
| 5,391,458 | 2/1995 | Conrad | 430/258 |
| 5,439,766 | 8/1995 | Day et al. | 430/18 |
| 5,516,626 | 5/1996 | Ohmi et al. | 430/328 |
| 5,747,223 | 5/1998 | Allen et al. | 430/325 |

*Primary Examiner*—Sharon Gibson
*Assistant Examiner*—Jill N. Holloman
*Attorney, Agent, or Firm*—Scully, Scott, Murphy & Presser; Lawrence R. Fraley, Esq.

[57] ABSTRACT

A process of tenting plated through holes with a photoimageable dielectric is provided which includes a dielectric film comprising a photoimageable epoxy based resin layer and a peelable polyester layer. In accordance with the process of the present invention, the peelable polyester layer of the dielectric film is removed prior to baking, developing, patterning or curing the structure.

23 Claims, 3 Drawing Sheets

PROCESS FOR TENTING PTH'S WITH PID DRY FILM

TECHNICAL FIELD

The present invention relates to a process for fabricating a laminate chip carrier which contains a tentable photoimageable dielectric (PID) layer. The PID employed in the present invention comprises a cationically polymerizable epoxy based resin layer which is sandwiched between a polyester support sheet and a polyolefin separator sheet. To fabricate a laminate chip carrier structure of the present invention, the polyolefin separator sheet is removed from the PID, the PID is laminated to a subcomposite structure containing plated through holes (PTH's) and the peelable polyester support film is not removed until after exposure of the PID.

PRIOR ART

PID's are used to create redistribution layers for fanning-out escape routes from chips and to shrink package size. There are several methods to form PID layers and many employ liquid formulations. An inherent drawback of liquid formulations is that they tend to flow into plated through holes (PTH's) and not tent. Thus, a prior hole fill operation is necessary when liquid PID formulations are employed. Despite having some success, this means for overcoming the aforementioned problem is not practical since it is a messy operation and it could add additional costs to the manufacturing process.

Another potential problem with liquid PID's is that they often times generate an unacceptable level of defects in the structure called pin-holes. This is especially troublesome if the PID has excellent resolution. For example, dirt may become trapped in the wet PID during the drying operation and it may prevent light from exposing the PID. These openings or pin-holes can cause shorting between layers when the PID is plated. Moreover, there can be a reliability concern with pin-holes because the subcomposite has the potential for partial etch-out if a pin-hole falls on about 75% of a line.

In view of these drawbacks mentioned hereinabove, there is a continued need to develop new and improved processes for using PID's that overcome the problems associated with prior art PID's.

SUMMARY OF THE INVENTION

One object of the present invention is to provide a process of fabricating a PID that is tentable. By "tentable" it is meant that the PID of the present invention has the capability of being stretched over PTH's which are present on the surface of a subcomposite material. Hence, the tentable PID of the present invention is not further pulled into the PTH's during the processing steps of the present invention.

Another object of the present invention is to provide a process for fabricating a PID for contact exposure which does not require that the PTH's be filled with a conductive paste or resin.

A further object of the present invention is to provide a process of fabricating a PID for contact exposure which does not generate unacceptable levels of pin-holes in the laminate structure.

These as well as other objects are achieved by the present invention by utilizing a PID that is laminated with a peelable polyester support film which is not removed until after the exposure process. Specifically, in accordance with the present invention, a process of fabricating a laminate chip carrier containing a tentable photoimageable dielectric (PID) film is provided which comprises the steps of:

(a) providing a dielectric film having a photoimageable cationically polymerizable epoxy based resin layer and a peelable polyester support layer;

(b) laminating said photoimageable epoxy based resin layer of said dielectric film to at least one surface of a subcomposite having plated through holes therein;

(c) exposing the dielectric film of the structure provided in step (b) to a pattern of radiation under conditions effective to selectively harden portions of said photoimageable epoxy based resin layer, wherein said harden portions extend over one or more of said plated through holes; and (d) removing said peelable polyester support layer from said photoimageable epoxy based resin layer.

In one embodiment of the present invention, microvias are formed in the photoimageable epoxy based resin layer which is not hardened in step (c). Specifically, the microvias are fabricated in the present invention by first conducting steps (a)–(d) mentioned hereinabove and then the following additional steps are preformed:

(e) baking the structure provided in step (d) above;

(f) developing said baked structure to form microvias in the structure;

(g) exposing said developed structure to UV energy; and (h) curing said UV exposed structure.

In another embodiment of the present invention, at least one wiring layer is formed in contact with the cured photoimageable epoxy based resin layer of the structure provided by steps (a)–(h). Typically, the wiring layer is formed directly on top of the PTH's.

In a further embodiment of the present invention, metal layers are provided onto the cured structure utilizing conventional techniques well known to those skilled in the art, e.g. sputter coating with Cr/Cu/Cr, and then etching the metal layers to make lines and spaces thereon.

DETAILED DESCRIPTION OF THE INVENTION

Figure 1A:
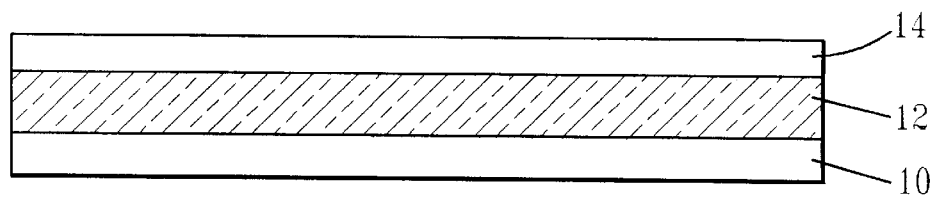
FIGS. 1(a)–(e) are cross sectional views showing a PID film and a subcomposite structure during the various process steps of the present invention.

The present invention will now be described in more detail by referring to the drawings, wherein like elements are referred to by like numerals. Specifically, process steps (a)–(h) mentioned hereinabove are shown in FIGS. 1(a)–(e). Referring first to FIG. 1(a), there is shown a dielectric film that is employed in the present invention as the PID. Specifically, the dielectric film comprises a photoimageable epoxy based resin layer 12 which is sandwiched between a polyolefin layer 10 and a peelable polyester layer 14. It should be noted that polyolefin layer 10, e.g. polypropylene, polyethylene, polybutylene and the like, is removed prior to its use and is thus not present in the process of the present invention. The polyester resin that may be used in the present invention as layer 14 must be optically clear. An example of a clear peelable polyester resin that can be employed as layer 14 is MYLAR®.

The photoimageable cationically polymerizable epoxy based resin layer 12 is comprised of solids and solvent. The solids are preferably comprised of an epoxy resin system which comprises from about 10% to about 80% by weight, preferably 20% to 40% by weight, more preferably about 30% by weight, of a phenoxy polyol resin which is a condensation product of epichlorohydrin and bisphenol A having a molecular weight of between about 40,000 and about 130,000, preferably about 60,000 to about 90,000, more preferably greater than about 60,000; from about 20% to about 90% by weight, more preferably from about 25% to about 30% by weight, most preferably about 25% by weight, of an epoxidized multifunctional bisphenol A formaldehyde novolac resin having a molecular weight of from about 4,000 to about 10,000, preferably about 5,000 to about 7,000; from about 0% to about 50% by weight, preferably from about 35% to about 50% by weight, more preferably about 45% by weight, of a halogenated, preferably brominated, diglycidyl ether of bisphenol A having a molecular weight of from about 600 to about 2,500, preferably about 1,000 to about 1,700; and from about 0.1 to about 15 parts, preferably about 5 parts, by weight of the total epoxy resin of a cationic photoinitiator capable of initiating polymerization of said epoxy based resin system. The solvent component of the epoxy based resin system employed in the present invention is comprised of propyleneglycol monomethyl ether acetate and 0 to less than about 10% propylene carbonate. The propylene carbonate is preferably the carrier for the photoinitiator.

Preferably, the phenoxy polyol resin has an epoxide value of from about 0.001 to about 3, more preferably about 0.03 equivalents per kg, a weight per epoxide of from about 10,000 to about 60,000, more preferably from about 20,000 to about 50,000, most preferably about 37,000 and a glass transition temperature of from about 80° C. to about 150° C., more preferably from about 90° C. to about 110° C., most preferably about 98° C.

Preferably, the multifunctional epoxy bisphenol A formaldehyde novolac resin has an epoxide value of from about 1 to about 10, more preferably from about 3 to about 6, most preferably about 4.7 equivalents per kg, a weight per epoxide of from about 180 to about 300, more preferably from about 190 to about 230, most preferably about 215 and a melting point of from about 60° C. to about 150° C., more preferably from about 70° C. to about 90° C., most preferably about 82° C.

Preferably, the diglycidyl ether of the halogenated bisphenol A, has an epoxide value of from about 0.1 to about 5, more preferably from about 1 to about 3, most preferably about 1.5 equivalents per kg, a weight per epoxide of from about 200 to about 1000, more preferably from about 500 to about 750, most preferably 675 and a melting point of from about 70° C. to about 150° C., more preferably from about 80° C. to about 110° C., most preferably about 97° C.

A suitable phenoxy polyol resin is available under the tradename "PKHC", formerly available from Union Carbide Corporation, now available from Phenoxy Resin Associates. A suitable multifunctional bisphenol A, formerly available under the tradename Epirez-SU-8 from High Tek Polymers, is now available as "Epon 1183" from Shell Oil Company. A suitable complex triarylsulfonium hexafluoroantimonate salt photoinitiator, formerly available under the tradename 1014 from General Electric Company, is now available as "UVI-6974" from Union Carbide.

It should be noted that the epoxy based resin system of the present invention in the steps before developing has an elevated solvent content of an amount sufficient to prevent cracking and provide plasticity to the dielectric film during handling and to assist flow of the dielectric film during lamination with the subcomposite. By "elevated solvent content" it is meant that the solvent amount in the epoxy based resin system ranges from about 5% to about 30% by weight, preferably from about 9% to about 15%, more preferably from about 11.5% to about 13%.

Figure 1B:
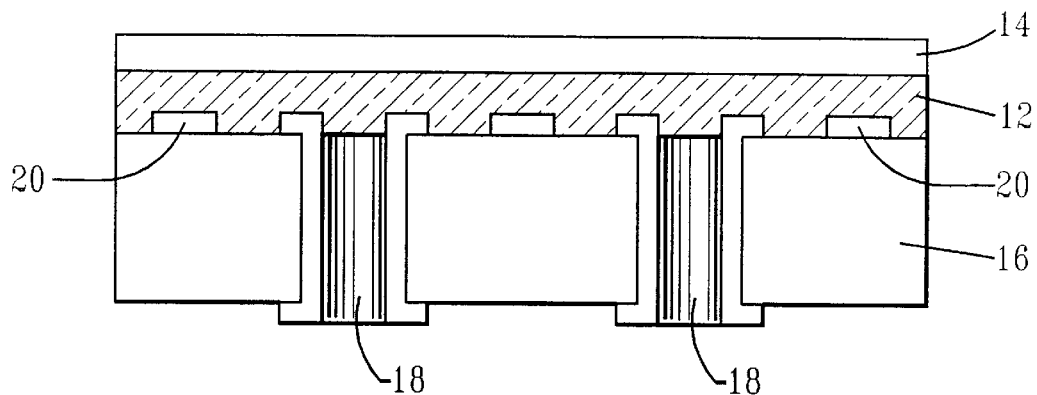

Photoimageable layer 12 of the dielectric film is then laminated onto one or both surfaces of subcomposite 16 which contains plated through holes 18 and capture pads 20. For clarity, in the drawings, this lamination is shown only to one surface of subcomposite 16. Typically, holes 18 are plated with a metal such as Cu, Cr, W, Al and the like using well known plating techniques. Capture pads 20 are composed of material well known to those skilled in the art and are formed on the surface of subcomposite 16 using techniques that are equally well known to those skilled in the art. A suitable material for capture pad 20 is Cu. This laminate structure is shown in FIG. 1(b).

Prior to lamination of subcomposite 16 with photoimageable layer 12, the top surface metallurgy of subcomposite 16 is treated to increase the photoimageable layer to metal adhesion. This treatment consists of processes well known to those skilled in the art and include, but are not limited to, mechanical roughening with pumice and vapor blast, chemical roughening with etchants and oxide treatments, and chemical adhesion promoters such as silane coupling agents. A preferred treatment for Cu is black oxide which is formed by the action of an oxidizing agent such as sodium chlorite with Cu. Lamination of photoimageable layer 12 of the dielectric film to subcomposite 16 is conducted using techniques well known to those skilled in the art. A preferred means of providing the laminate structure illustrated in FIG. 1(b) is by vacuum lamination.

The subcomposites employed in the present invention are conventional electronic structures which are fabricated by means well known to those skilled in the art. Typically, in the present invention, the subcomposite is a printed circuit card or board which is composed of, but not limited to, a brominated epoxy resin impregnated in glass cloth.

In addition to plated through holes 18 and capture pads 20, subcomposite 16 may contain other intermediate layers or have circuitry thereon. For clarity, these additional elements are not shown in the drawings of the present invention.

Figure 1C:
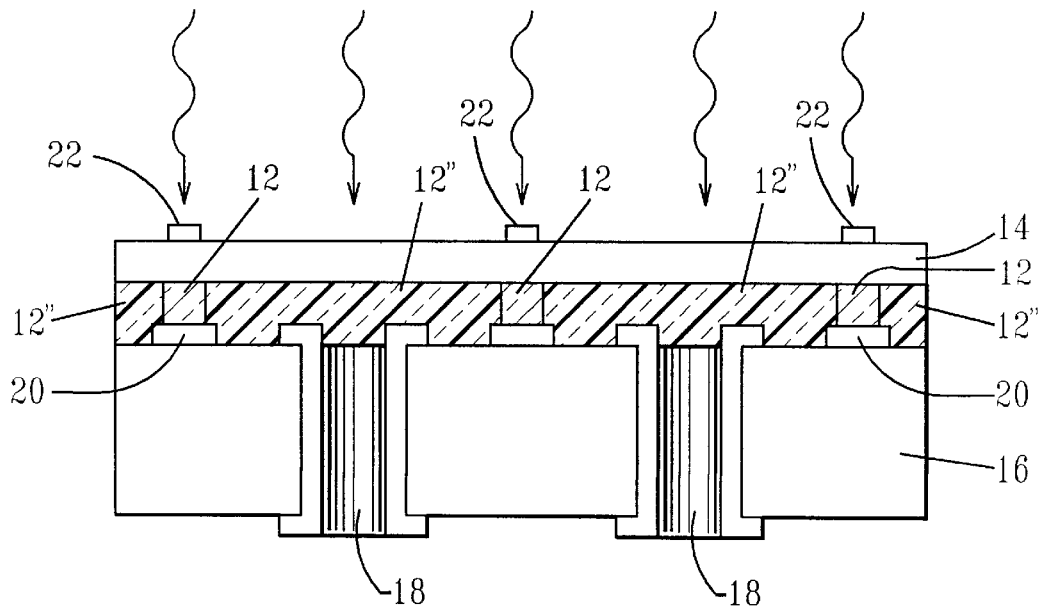

After providing the laminate structure shown in FIG. 1(b), that structure, particularly the photoimageable epoxy based resin layer of the laminate, is exposed to a pattern of radiation under conditions effective to selectively harden portions of layer 12 such that the harden portions extend over one or more of plated through holes 18. FIG. 1(c) represents this step of the present invention, wherein the harden portions are designated as 12".

This selective hardening process is carried out by overlaying photo-master 22 on top of layer 12 and then using a conventional exposure device operating at a photo-master contact pressure of from about 3 to about 8 psi, an energy from about 800 to about 2000 milliJoules/cm$^2$, using a 365 nanometer arc 8 Kilowatt lamp. More preferably, the exposure is carried out at a photo-master pressure of from about 4 to about 6 psi, an energy of from about 1000 to about 1500 milliJoules/cm$^2$, using a 365 nanometer arc 8 Kilowatt lamp. The most preferred conditions for providing the selective hardening effect to photoimageable layer 12 are 5 psi, 1500 milliJoules/cm$^2$, using an 8 Kilowatt lamp.

Figure 1D:
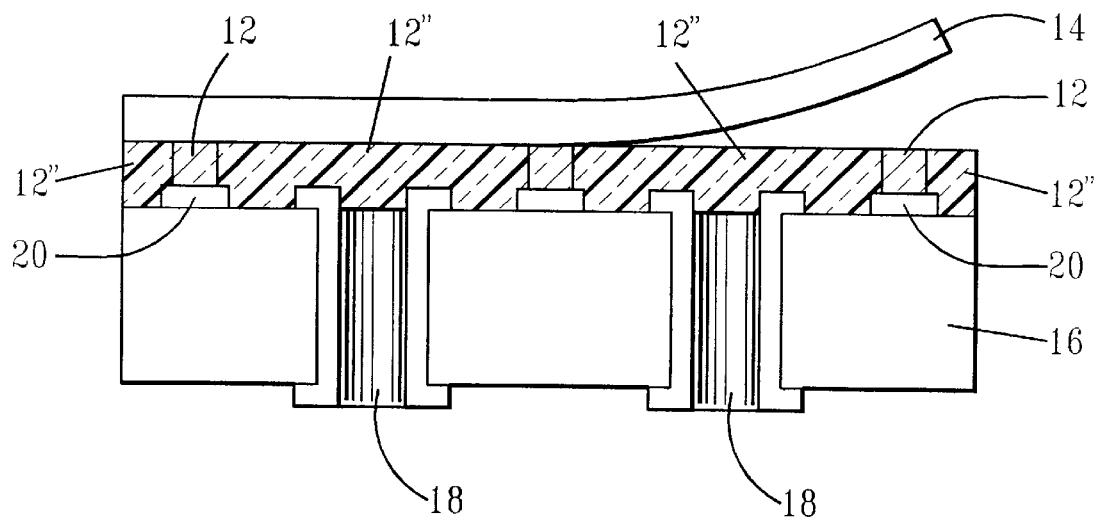

The next step of the present invention is shown in FIG. 1(d). As is shown therein, polyester support layer 14 is peeled away from photoimageable layer 12 and harden portions 12". It is noted that this step of the invention must be done immediately after exposure of photoimageable layer 12 otherwise peelable polyester support layer 14 will tear leaving portions thereof that cannot be removed from the laminate structure by subsequent processing steps.

After removing polyester support layer 14, the structure is then baked at temperatures which are effective to crosslink and toughen the photoimageable film. Specifically, baking is conducted at temperatures of from about 100° C. to about 140° C. for a time period of from about 15 to about 120 minutes. More preferably, baking is conducted at temperatures of from about 120° C. to about 130° C. for a time period of about 30 to about 60 minutes. Partial curing of the photoimageable film is obtained in this step of the present invention. It is noted that the above conditions lower the amount of solvent that is present in photoimageable layer 12 and harden portions 12".

The baked structure is then developed using conditions which are well known in the art. Typically, the structure, particularly photoimageable layer 12, is developed using an organic solvent that dissolves any unexposed material. Generally, the pattern is developed by conventional methods which include, but are not limited to, using propylene carbonate, gamma butyrolactone, diglyme or mixtures thereof. A highly preferred method of developing the photoimageable layer in the present invention is disclosed in U.S. Pat. No. 5,268,260, the contents of which are incorporated herein by reference.

It should emphasized that the development process produces microvias 24 having a diameter of from about 1 to about 5 mils, more preferably about 3 to about 5 mils, in the photoimageable dielectric layer. Thus, the structure of the present invention contains fine holes which extend to subcomposite 16.

Following development, the harden portions 12" are exposed to a blanket exposure process using a UV cure tool that operates at a high UV energy. By "high UV energy" it is meant that the blanket exposure step is conducted at energies of from about 2 to about 6 Joules/cm$^2$, more preferably about 4 Joules/cm$^2$.

Permanent curing of the structure is carried out at temperatures of from about 150° C. to about 190° C. for a time period of from about 30 to about 120 minutes. More preferably, the final cure is carried out at temperatures of about 160° C. to about 180° C. for about 45 to about 90 minutes.

Figure 1E:
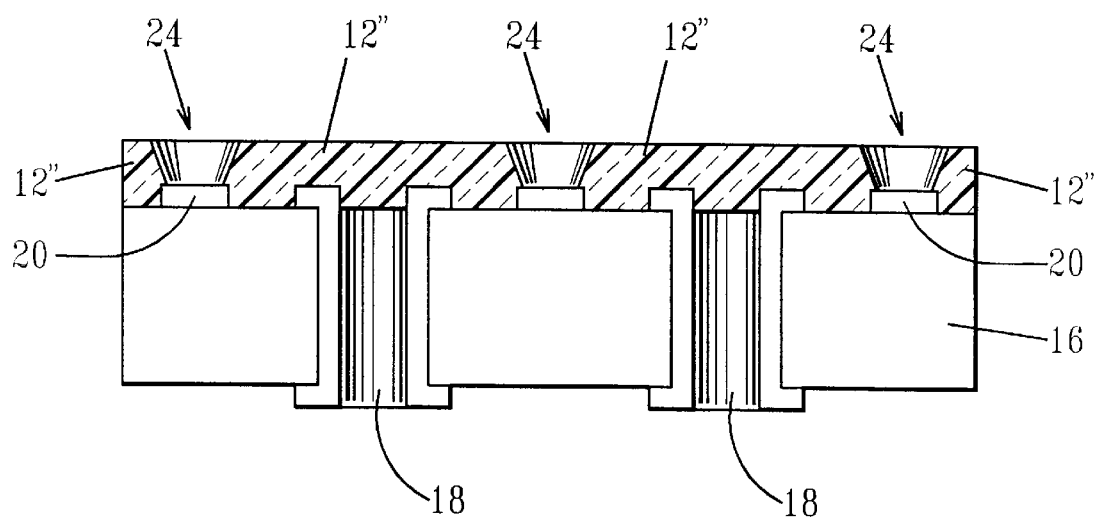

The above process provides a firm, impervious, permanent electrically insulating structure which, after surface roughening, is suitable for the reception of metal circuitry thereon. The final structure, without circuitry, is shown in FIG. 1(e). The final structure contains tented photoimageable portions 12" (previously designated as harden portions) and microvias 24. Surface roughening is conducted using techniques well known to those skilled in the art. Suitable techniques include, but are not limited to, using a swelling agent, a hole cleaning operation, an oxidizing agent, a plasm treatment, a vapor blast or a mechanical abrasive operation.

The metal circuitry is applied to the structure shown in FIG. 1(e) using techniques well known to those skilled in the art. For example, see U.S. Pat. No. 5,097,593 to Jones, the contents of which are incorporated herein by reference.

Figure 2A:
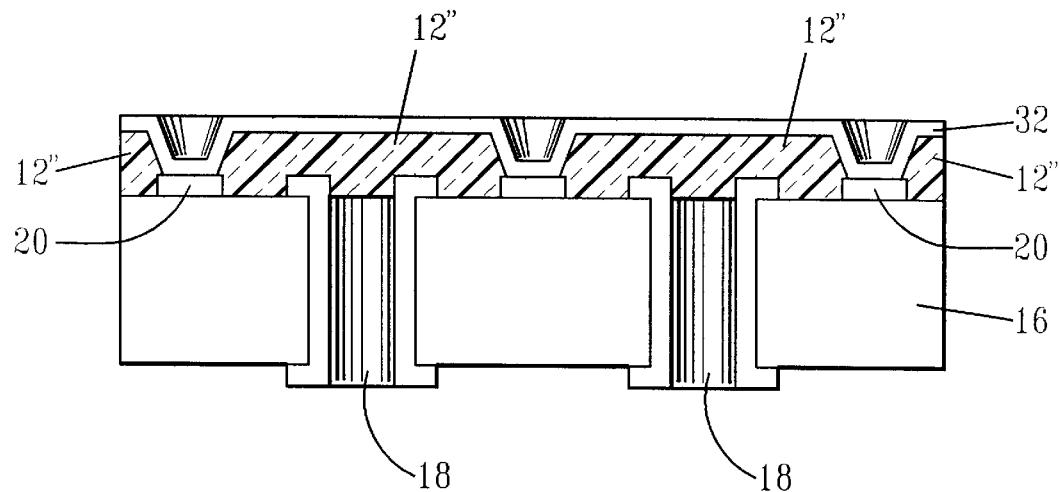
FIGS. 2(a)–(b) are cross-sectional views of a laminate chip carrier containing (a) Cu lines, and (b) Cu lines and spaces.
Figure 2B:
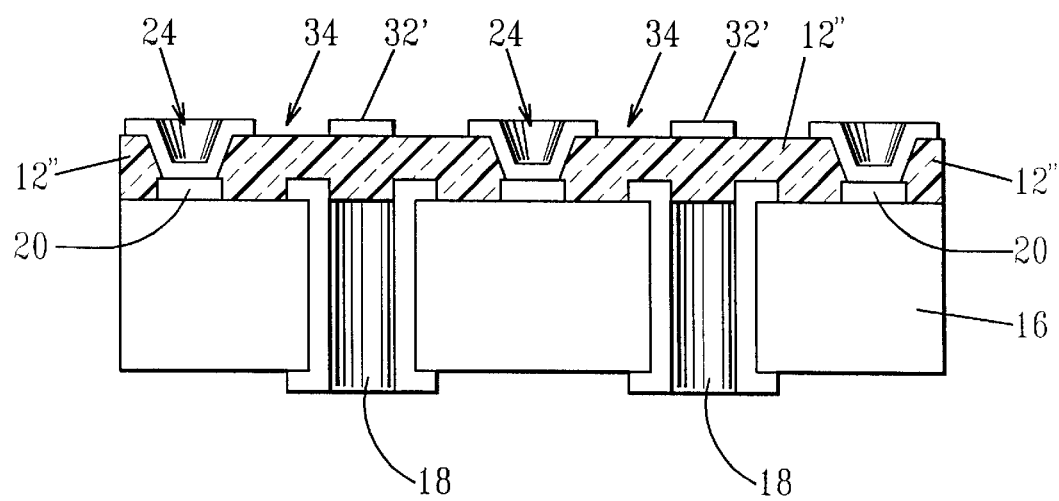

Another embodiment of the present invention, is shown in FIGS. 2(a) and 2(b). Reference is first made to FIG. 2(a) which shows a structure which comprises harden portions 12", subcomposite 16, plated through holes 18, microvias 24 and capture pads 20.

Metal layer 32 is then deposited on top of harden portions 12" and microvias 24 using conventional techniques well known to those skilled in the art. An example of such a process is by sputtering a conductive metal onto the surface of the photoimageable dielectric (PID) and into the microvias. Other means for depositing metal layer 32 include, but are not limited to, full additive electroless, plating and metal plating followed by subtractive etching. Suitable conductive metals include, but are not limited to, Cr, Al, Cu and the like. Mixtures of these metals or multiple layers thereof, e.g. Cr/Cu/Cr, are also contemplated herein.

Typically, the metal layer has a thickness of from about 5 to about 40 micrometers. More preferably, the thickness of the metal line is from about 10 to about 25 micrometers.

Metal layer 32 is patterned with a standard photolithographic process. The metal is removed by either a dry etch or a chemical etch to make lines 32' and spaces 34 on the structure. This step of the present invention is shown in FIG. 2(b).

Suitable dry etching techniques that may be employed in the present invention include reactive ion etching (RIE), ion beam etching (IBE) and plasma etching. Of these dry etching techniques, RIE is particularly preferred in the present invention. When a wet etch is employed to etch metal layer 32, the chemical etchant employed is selected from the group consisting of cupric or ferric chloride, potassium permanganate, $H_2O_2$, chromic acid and the like. Mixtures of these chemical etchants alone or with water are also contemplated herein. The chemical etchant may also be buffered to a desire pH using known buffering agents. A preferred chemical etchant employed in the present invention is cupric chloride or ferric chloride.

The final structure which contains microvias 24 is shown in FIG. 2(b). It should be noted that if an error is made, the structure is reworkable because the thin metal lines can be etched from the surface and the plated through holes are protected by the tented photoimageable portion 12".

While the invention has been particularly shown and described with respect to preferred embodiment thereof, it will be understood by those skilled in the art that the foregoing and other changes in form and details may be made therein without departing from the spirit and scope of the invention.

Having thus described our invention, what we claim as new, and desire to secure by the Letters Patent is:

1. A process of fabricating a laminate chip carrier containing a tented photoimageable dry film, said process comprising:

(a) providing a dry dielectric film having a photoimageable epoxy based resin layer and a peelable polyester support layer, wherein said epoxy based resin layer comprises about 10% to about 80%, by weight, of a polyol resin which is a condensation product of epichlorohydrin and bisphenol A having a molecular weight of from about 40,000 to about 130,000; about 20% to about 90%, by weight, of an epoxidized multifunctional bisphenol A formaldehyde novolac resin having a molecular weight of from about 4,000 to about 10,000; about 0% to about 50%, by weight, of a halogenated epoxidized diglycidyl ether of bisphenol A having a molecular weight of from about 600 to about 2,500, and about 0.1 to about 15 parts by weight of the total weight of the epoxy resin system of a cationic photoinitiator;

(b) vacuum laminating said photoimageable epoxy based resin layer of said dry dielectric film to at least one surface of a subcomposite having plated through holes therein wherein said dry dielectric film is stretched over said plated through holes during said laminating;

(c) exposing the dry dielectric film of the structure provided in step (b) to a pattern of radiation under conditions effective to selectively harden portions of said photoimageable epoxy based resin layer, wherein said harden portions extend over one or more of said plated through holes; and (d) removing said peelable polyester support layer from said photoimageable epoxy based resin layer.

2. The method of claim 1 further comprising the steps of:

(e) baking said structure provided in step (d);

(f) developing said baked structure to provide microvias in the photoimageable layer;

(g) exposing said developed structure to UV energy; and (h) curing said UV exposed structure.

3. The process of claim 2 further comprising forming at least one wiring layer on top of the cured photoimageable layer provided in step (h).

4. The process of claim 2 wherein step (e) is conducted at a temperature of from about 100° C. to about 140° C. for a time period of about 30 to about 120 minutes.

5. The process of claim 4 wherein step (e) is conducted at a temperature of from about 120° C. to about 130° C. for a time period of about 30 to about 60 minutes.

6. The process of claim 2 wherein step (f) is conducted using propylene carbonate, gamma butyrolactone, diglyme or mixtures thereof.

7. The process of claim 2 wherein step (g) is carried out at an energy of from about 2 to about 6 Joules/cm$^2$.

8. The process of claim 2 wherein step (h) is conducted at a temperature of from about 150° C. to about 190° C. for a time period of from about 30 to about 120 minutes.

9. The process of claim 8 wherein step (h) is conducted at a temperature of from about 160° C. to about 180° C. for a time period of from about 45 to about 90 minutes.

10. The process of claim 2 further comprising providing at least one metal layer to the product of step (h).

11. The process of claim 10 wherein said metal layer is composed of at least one conductive metal.

12. The process of claim 11 wherein said conductive metal is Cu, Cr, Al or mixtures thereof.

13. The process of claim 10 wherein said metal layer is composed of a layer of Cr, a layer of Cu and a layer of Cr.

14. The process of claim 10 wherein said metal layer is etched to provide lines and spaces.

15. The process of claim 14 wherein said etch is a dry etch or a wet etch.

16. The process of claim 15 wherein said etch is a wet etch using a chemical etchant.

17. The process of claim 16 wherein said chemical etchant is cupric chloride or ferric chloride.

18. The process of claim 1 wherein said dry polyester layer of said dielectric film is composed of MYLAR®.

19. The process of claim 1 wherein said epoxy based resin layer further comprises propyleneglycol momomethyl ether acetate and, optionally, propylene carbonate in an amount of less than about 10% by weight.

20. The process of claim 1 wherein said subcomposite is a printed card or board.

21. The process of claim 1 wherein said subcomposite further contains intermediate layers and circuitry thereon.

22. The process of claim 1 wherein step (c) is carried out at a photo-master pressure of from about 3 to about 8 psi, an energy of from about 800 to about 2000 milliJoules/cm$^2$ using a 365 nanometer arc 8 Kilowatt lamp.

23. The process of claim 22 wherein step (c) is carried out at a photo-master pressure of from about 4 to about 6 psi, an energy of from about 1000 to about 1500 milliJoules/cm$^2$ using a 365 nanometer arc 8 Kilowatt lamp.

* * * * *